(12) United States Patent
Hieda et al.

(10) Patent No.: US 10,490,437 B2
(45) Date of Patent: Nov. 26, 2019

(54) SUSCEPTOR, VAPOR DEPOSITION APPARATUS, VAPOR DEPOSITION METHOD AND EPITAXIAL SILICON WAFER

(71) Applicant: SUMCO CORPORATION, Tokyo (JP)

(72) Inventors: Daisuke Hieda, Tokyo (JP); Hisashi Uchino, Nagasaki (JP); Tatsuo Kusumoto, Nagasaki (JP)

(73) Assignee: SUMCO CORPORATION, Tokyo (JP)

( * ) Notice: Subject to any disclaimer, the term of this patent is extended or adjusted under 35 U.S.C. 154(b) by 474 days.

(21) Appl. No.: 15/088,440

(22) Filed: Apr. 1, 2016

(65) Prior Publication Data

US 2016/0300753 A1 Oct. 13, 2016

(30) Foreign Application Priority Data

Apr. 7, 2015 (JP) .................................. 2015-078561
Nov. 9, 2015 (JP) .................................. 2015-219532

(51) Int. Cl.
- *H01L 21/687* (2006.01)
- *H01L 21/02* (2006.01)
- *H01L 29/16* (2006.01)
- *C23C 16/458* (2006.01)

(52) U.S. Cl.
CPC .... *H01L 21/68785* (2013.01); *C23C 16/4584* (2013.01); *H01L 21/0262* (2013.01); *H01L 21/02381* (2013.01); *H01L 21/02532* (2013.01); *H01L 21/68771* (2013.01); *H01L 29/16* (2013.01)

(58) Field of Classification Search
CPC combination set(s) only.
See application file for complete search history.

(56) References Cited

U.S. PATENT DOCUMENTS

| | | | |
|---|---|---|---|
| 2008/0110402 A1* | 5/2008 | Simpson | H01L 21/68757 118/728 |
| 2008/0224270 A1 | 9/2008 | Ikubo et al. | |
| 2009/0127672 A1* | 5/2009 | Kinbara | C23C 16/4588 257/652 |

(Continued)

FOREIGN PATENT DOCUMENTS

| | | |
|---|---|---|
| CN | 101423977 A | 5/2009 |
| JP | 59-032123 | 2/1984 |

(Continued)

OTHER PUBLICATIONS

Office Action issued in Republic of Korea Counterpart Patent Appl. No. 10-2016-0040786, dated Aug. 17, 2017, along with an English translation thereof.

(Continued)

*Primary Examiner* — Laura C Powers
(74) *Attorney, Agent, or Firm* — Greenblum & Bernstein, P.L.C.

(57) ABSTRACT

A disc-shaped susceptor includes a plurality of recesses that are aligned in a circumferential direction on an upper surface of the susceptor and in which wafers are respectively mounted, in which the susceptor is formed so that a center of the susceptor is concave toward a lower surface thereof from an outer edge thereof.

4 Claims, 7 Drawing Sheets

(56) References Cited

U.S. PATENT DOCUMENTS

| | | | | |
|---|---|---|---|---|
| 2010/0163524 A1* | 7/2010 | Arai | ................ | C23C 16/4581 |
| | | | | 216/33 |
| 2014/0235007 A1* | 8/2014 | Han | ................ | H01L 21/67326 |
| | | | | 438/46 |

FOREIGN PATENT DOCUMENTS

| | | |
|---|---|---|
| JP | 1-256117 A | 10/1989 |
| JP | 01-313925 | 12/1989 |
| JP | 6-204147 A | 7/1994 |
| JP | 8-279470 A | 10/1996 |
| JP | 2004-327761 | 11/2004 |
| JP | 2005-311290 | 11/2005 |
| JP | 2007-227838 | 9/2007 |
| JP | 2008-152085 | 7/2008 |
| JP | 2008-187020 | 8/2008 |
| JP | 2009-111296 A | 5/2009 |
| JP | 2010-34185 A | 2/2010 |
| JP | 2011-77171 | 4/2011 |
| JP | 2011-187887 A | 9/2011 |
| JP | 2014-207357 A | 4/2013 |
| JP | 2013-136475 A | 7/2013 |
| KR | 10-2009-0071003 A | 7/2009 |
| KR | 2011-0116897 | 10/2011 |
| KR | 10-2013-0043443 | 4/2013 |
| WO | 2006/070556 A1 | 6/2006 |

OTHER PUBLICATIONS

Search Report issued in European Patent Office (EPO) Patent Application No. 16164006.5, dated Feb. 20, 2017.
Search Report issued in European Patent Office (EPO) Patent Application No. 16164006.5, dated Oct. 13, 2016.
Office Action issued in Republic of Korea Counterpart Patent Appl. No. 04/23/2018, dated 10-2016-0040786, along with an English translation thereof.
Notice of Reason(s) for Rejection received in JP 2015-219532 and English language translation thereof, dated Nov. 13, 2018.
Notice of Reasons for Rejection received in KR Application No. 10-2018-0055378, dated Dec. 28, 2018.
Third Notification of Examiner's Opinion received in Chinese Patent Application No. 201610208532.3, dated Dec. 17, 2018.
Office Action issued in Republic of Korea Counterpart Patent Appl. No. 10-2018-0055378, dated Jun. 20, 2018, along with an English translation thereof.
Notice of allowance issued in Korean Patent Application No. 10-2018-0055378, dated Jun. 25, 2019.

* cited by examiner

SUSCEPTOR, VAPOR DEPOSITION APPARATUS, VAPOR DEPOSITION METHOD AND EPITAXIAL SILICON WAFER

The entire disclosure of Japanese Patent Applications No. 2015-078561 filed Apr. 7, 2015 and No. 2015-219532 filed Nov. 9, 2015 is expressly incorporated by reference herein.

TECHNICAL FIELD

The present invention relates to a susceptor, a vapor deposition apparatus, a vapor deposition method and an epitaxial silicon wafer.

BACKGROUND ART

A batch-type vapor deposition apparatus that includes a susceptor having a plurality of recesses on an upper surface thereof and simultaneously processes a plurality of wafers, for instance, made of silicon has been typically known.

An epitaxial wafer manufactured by such a vapor deposition apparatus is used for a power device represented by IGBT (Insulated Gate Bipolar Transistor). In the epitaxial wafer used for the power device, an epitaxial film thickness is large and often reaches about 100 µm. With such a thick film thickness, although the wafers are respectively mounted in the recesses on the susceptor, a sticking phenomenon (hereinafter, referred to as "sticking"), in which an inner circumferential surface of each of the recesses and an outer circumferential surface of the corresponding wafer stick to each other due to deposits called "bridge" extending therebetween, easily occurs. When the sticking occurs, an epitaxial film at a sticking part needs to be peeled off in removing the wafers from the susceptor after the epitaxial film growth. At that time, since a considerable force is applied on a peripheral portion of each of the wafers, some of the wafers are often cracked to be occasionally broken.

Accordingly, various studies for restraining occurrence of the sticking have been made (see, for instance, Patent Literature 1: JP-A-2004-327761, Patent Literature 2: JP-A-2007-227838, and Patent Literature 3: JP-A-2008-187020).

In Patent Literature 1, a convex portion is provided on a bottom of the recess of the susceptor in a manner to project from a peripheral portion thereof. With this arrangement, even when the wafer is moved in a radial direction by centrifugal force in association with rotation of the susceptor, a tapered surface on a rear side of the peripheral portion of the wafer is brought into contact with the convex portion, thereby concentrically holding the wafer in the concave portion, so that the occurrence of the sticking is restrained.

Patent Literature 2 discloses that, when the wafer is freely dropped from a delivery robot into the concave portion, such free dropping of the wafer is disturbed by residual gas in the concave portion, so that the wafer is placed at a position deviated from a target position. In order to solve this problem, in Patent Literature 2, the susceptor and a rotary mechanism around a vertical axis of the susceptor is slightly inclined, so that the bottom of the recess is inclined. With this arrangement, an interval between the freely dropped wafer and the bottom of the recess is partially changed, thereby discharging the residual gas only in one direction to smoothly remove the residual gas, so that the wafer is restrained from being placed at a position deviated from the target position.

In Patent Literature 3, it is focused that an increase in a surface roughness of the bottom of the recess and a decrease in a contact area between the wafer and the bottom of the recess are important for effectively preventing the sticking between the rear side of the wafer and the bottom of the recess and that the sticking between the rear side of the wafer and the bottom of the recess occurs only on the peripheral portion of the wafer and does not occur on the center thereof. Based on these findings, Patent Literature 3 is arranged so that surface roughness on a peripheral area of the bottom of the recess is larger than surface roughness on the central area thereof.

However, in the arrangement of Patent Literature 1, since the rear side of the wafer and the inner circumferential surface of the recess are in contact, the sticking may possibly occur at this contact part.

In the arrangement of Patent Literature 2, since the rotary mechanism around the vertical axis of the susceptor is inclined, when the recess is moved in association with the rotation of the susceptor to be positioned lower in an inclined direction than a rotary axis, the inclined direction of the recess and the direction of centrifugal force are aligned to move the wafer to a lower side in the inclined direction. As a result, the wafer is brought into contact with the inner circumferential surface of the recess by the centrifugal force in association with the rotation of the susceptor, which may possibly cause the sticking.

Further, in the arrangement of Patent Literature 3, since no countermeasure against shifting of the wafer in the recess is taken, the wafer and the inner circumferential surface of the recess are brought into contact with each other, which may possibly cause the sticking.

SUMMARY OF THE INVENTION

An object of the invention is to provide a susceptor capable of restraining occurrence of sticking, a vapor deposition apparatus, a vapor deposition method and an epitaxial silicon wafer.

According to an aspect of the invention, a disc-shaped susceptor that is provided in a vapor deposition apparatus and on which wafers are mounted includes: a plurality of recesses that are aligned in a circumferential direction on an upper surface of the susceptor and in which the wafers are respectively mounted, in which the susceptor is formed so that a center of the susceptor is concave toward a lower surface thereof from an outer edge thereof.

Herein, that "the center of the susceptor is concave toward the lower surface of the susceptor from the outer edge thereof" means that a vertical height of the upper surface of the susceptor from a bottom of a reaction pipe is gradually decreased from the outer edge toward the center. In other words, the susceptor of the invention is a so-called bowl-shaped susceptor entirely projecting downward.

In the above arrangement, provided that a diameter of the susceptor is denoted by D1 and a concave depth at the center relative to the outer edge on the upper surface of the susceptor is denoted by D2, the susceptor is preferably formed at D2/D1 in a range from more than 0% to less than 0.3%.

Herein, the diameter of the susceptor means a diameter of the upper surface of the susceptor in a plan view (when seen from the upper surface). The center of the susceptor defining the concave depth means an outer edge of a through hole when the through hole to be inserted with a rotary shaft is provided at the center of the susceptor, or alternatively, means the center of the susceptor when the through hole is not provided at the center of the susceptor.

In the above arrangement, a bottom of the recess preferably has a surface roughness Ra that is more than 0.5 µm.

Herein, the surface roughness Ra is a center line average roughness (Ra value) defined in accordance with JIS B 0601(2011).

In the above arrangement, a bottom of the recess preferably has a surface roughness Ra that is less than 16 μm.

According to another aspect of the invention, a vapor deposition apparatus includes the susceptor according to the above aspect of the invention.

According to still another aspect of the invention, a vapor deposition method using the vapor deposition apparatus according to the above aspect of the invention includes: mounting the wafers in the plurality of recesses of the susceptor, and growing an epitaxial film on a surface of each of the wafers while rotating the susceptor.

According to a further aspect of the invention, an epitaxial silicon wafer includes: a silicon wafer having a chamfered portion on a peripheral portion; and an epitaxial film formed on a surface of the silicon wafer, in which the chamfered portion is formed with a silicon grain boundary formation region in which a silicon grain boundary is formed.

In the above arrangement, the silicon grain boundary formation region preferably has a length of 30 mm or less in a circumferential direction of the silicon wafer.

In the above arrangement, the epitaxial film preferably has a film thickness in a range from 50 μm to 150 μm.

In the above arrangement, the silicon wafer is preferably a p+ type substrate, and the epitaxial film is preferably an n type film.

According to the above aspects of the invention, a susceptor, a vapor deposition apparatus, a vapor deposition method and an epitaxial silicon wafer which are capable of restraining occurrence of sticking can be provided.

DESCRIPTION OF EMBODIMENT(S)

An exemplary embodiment of the invention will be described with reference to the attached drawings. It should be noted that a shape of a susceptor is exaggerated in FIGS. 2A and 2B for easy understanding of features of the invention.

Arrangement of Vapor Deposition Apparatus

Figure 1A:
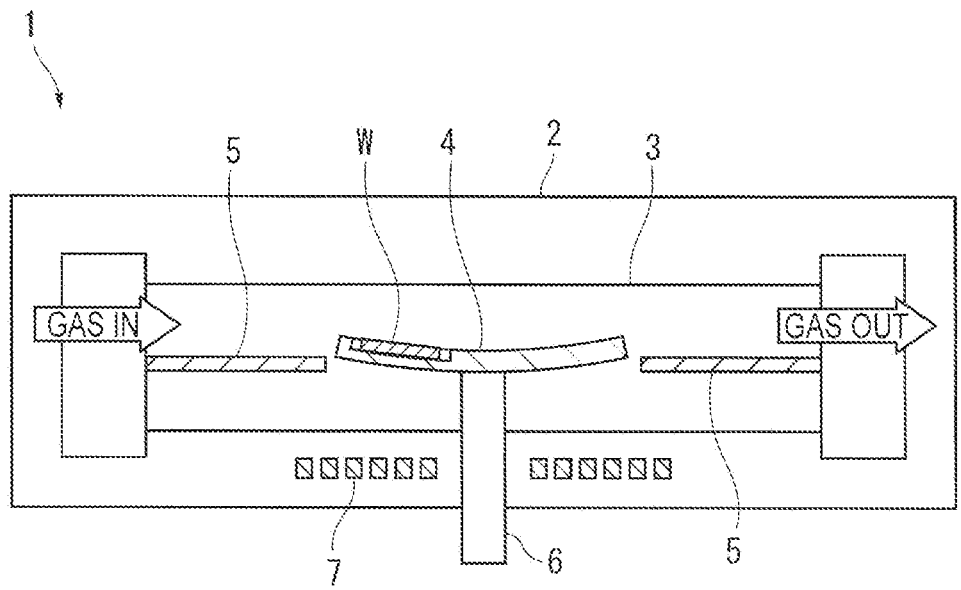
FIG. 1A is a cross-sectional view showing a vapor deposition apparatus according to an exemplary embodiment of the invention.
Figure 1B:
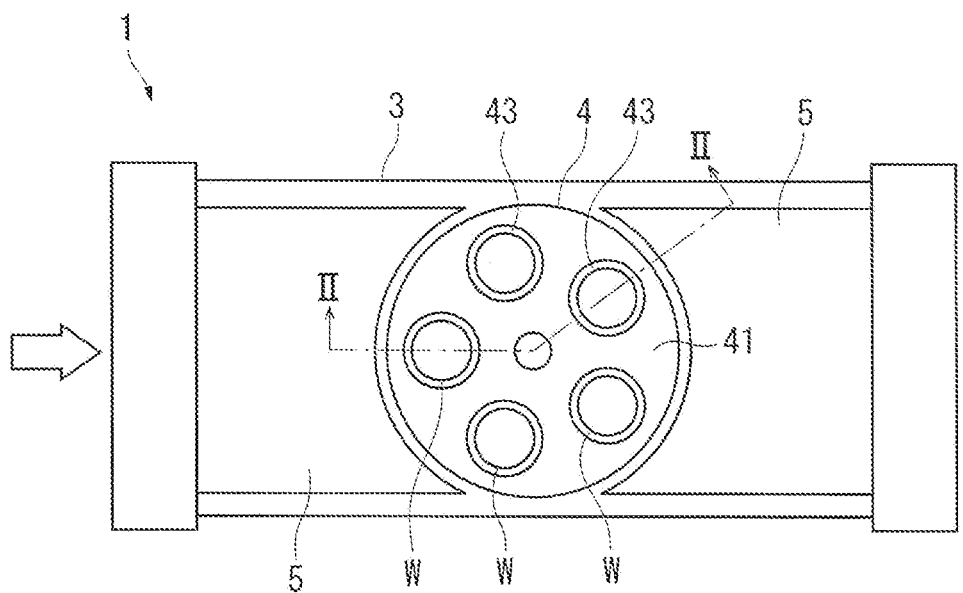
FIG. 1B is a plan view showing the vapor deposition apparatus according to the exemplary embodiment of the invention.

As shown in FIGS. 1A and 1B, a vapor deposition apparatus 1 includes a chamber 2 and a horizontally elongated reaction pipe 3 that is horizontally disposed in the chamber 2. A substantially disc-shaped susceptor 4 is provided at the center in a longitudinal direction in the reaction pipe 3. Moreover, horizontal partitions 5 are also provided in the reaction pipe 3 so that the susceptor 4 is interposed between the horizontal partitions 5 in the longitudinal direction.

Figure 2A:
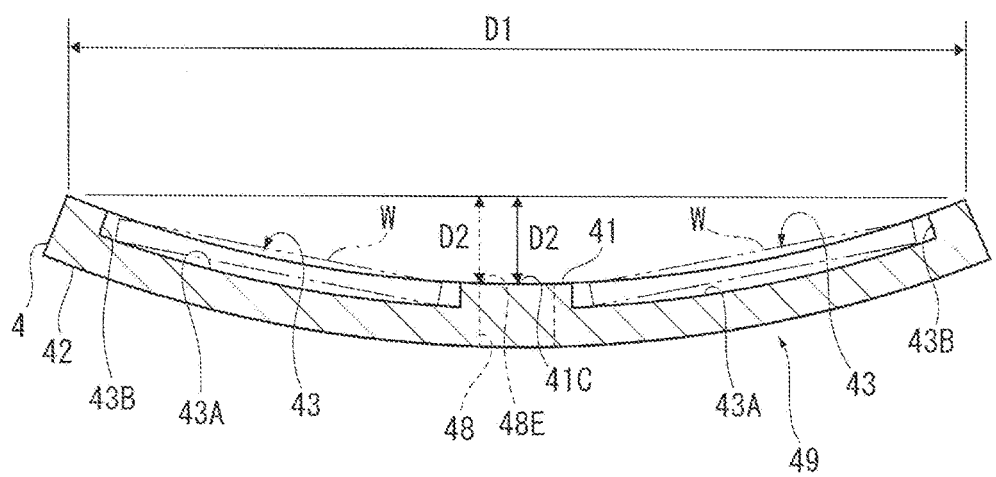
FIG. 2A is a cross-sectional view of a susceptor in the vapor deposition apparatus according to the exemplary embodiment of the invention, which is taken along a II-II line in FIG. 1B.

The susceptor 4 is substantially horizontally supported in the reaction pipe 3 by a support shaft 6 that is inserted to the susceptor 4 from a lower side of the susceptor 4 in a manner not to penetrate the susceptor 4. The susceptor 4 is rotated around a vertical axis at the center by rotation of the support shaft 6. An induction coil 7, which is a heating unit for heating an inside of the reaction pipe 3 with high-frequency to a predetermined temperature, is provided surrounding the support shaft 6 under the reaction pipe 3. It should be noted that resistance heating may be used for heating the inside of the reaction pipe 3. The partitions 5 together with the susceptor 4 divide the inside of the reaction pipe 3 into an upper space that is located above the susceptor 4 and a lower space that is located under the susceptor 4. Material gas is flowed in from a first side of the reaction pipe 3 into the upper space and is flowed out from a second side of the reaction pipe 3. As shown in FIG. 2A, on an upper surface 41 of the susceptor 4, in a plan view, a plurality of recesses 43 are aligned to be equidistant from each other in a circumferential direction of the susceptor 4 and to form a circle concentric with the susceptor 4. A wafer W is mounted in each of the recesses 43. An inner diameter of each of the recesses 43 only needs to be larger than a diameter of the wafer W. However, it is preferable that a difference between the inner diameter of each of the recesses 43 and the diameter of the wafer W is 1.0 mm or more. In other words, it is preferable that a gap between an outer edge of the wafer W and an inner circumferential surface 43B of each of the recesses (counterborings) 43 is 0.5 mm or more when the wafer W is mounted in each of the recesses 43 in a manner concentric with the recess 43.

The susceptor 4 is formed so that the center thereof is concave from the outer edge thereof toward a lower surface 42 and a vertical height of the upper surface 41 from the bottom of the reaction pipe 3 is gradually decreased from the outer edge toward the center.

Specifically, provided that a diameter of the upper surface 41 in a plan view is denoted by D1 and a concave depth at the center relative to the outer edge on the upper surface 41 of the susceptor 4 is denoted by D2, the susceptor 4 is formed at D2/D1 (flexure ratio) in a range from more than 0% to less than 0.3%.

Herein, in the exemplary embodiment, since no through-hole to be inserted with the support shaft 6 is provided at the center of the susceptor 4, a center 41C of the susceptor 4 defines the concave depth D2. It should be noted that, when a through-hole 48 in which the support shaft 6 is inserted is provided at the center of the susceptor 4 as shown by a chain double-dashed line in FIG. 2A, an opening edge 48E of the through-hole 48 defines the concave depth D2.

The susceptor 4 is formed of a carbon substrate having a thickness from about 10 mm to about 30 mm, in which a top surface of the substrate is coated with SiC according to a CVD method.

An inclined portion 49 of the susceptor 4 may have an arched cross section as shown in FIG. 2A, or alternatively, may have a straight cross section. Moreover, the susceptor 4 is preferably formed in a manner to be gradually concave further from the outer edge toward the center. Further, in order to keep balance with centrifugal force, the susceptor 4 may also be formed so that a curvature thereof is increased from the center toward the outer edge. The susceptor 4 may be concave by processing the carbon substrate or by making use of a difference in applied stress between the top surface and a rear surface of the susceptor 4.

A thickness of the susceptor 4 is preferably even. In other words, a curvature of the upper surface 41 is preferably equal to a curvature of the lower surface 42. When the thickness of the susceptor 4 is uneven, a temperature distribution in a plane of the wafer W heated through the susceptor 4 becomes uneven, which may cause slip dislocation.

Figure 2B:
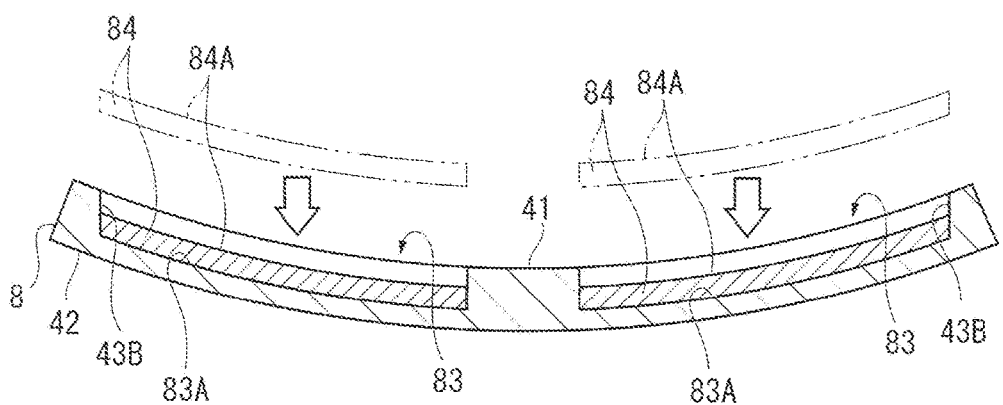
FIG. 2B is a cross-sectional view of a susceptor according to a modification of the invention in the vapor deposition apparatus, which is taken along the II-II line in FIG. 1B.

A bottom 43A of the recess 43 is directly processed so that the surface roughness Ra is in a range from more than 0.5 µm to less than 16 µm. Alternatively, as shown in FIG. 2B, an attachment 84 having a top surface 84A processed to have the same surface roughness Ra as that of the bottom 43A may be prepared and attached to the recess 83 of the susceptor 8. With this arrangement, even in the susceptor 8 in which the surface roughness Ra of the bottom 83A is 0.5 µm or less, the top surface 84A having the surface roughness Ra of more than 0.5 µm to less than 16 µm can serve as the bottom of the recess 83, so that the susceptor 8 can provide the same advantages as the susceptor 4.

Operation of Vapor Deposition Apparatus

Next, an operation of the vapor deposition apparatus 1 will be described.

In manufacturing an epitaxial wafer using the vapor deposition apparatus 1, an inside of the reaction pipe 3 of the vapor deposition apparatus 1 is heated to the temperature from 1000 degrees C. to 1190 degrees C. to perform a baking step and subsequently an epitaxial film growth step is started at the temperature from 1000 degrees C. to 1190 degrees C. In the epitaxial film growth step, while the reaction pipe 3 is heated to keep the above-described predetermined temperature, material gas is flowed in from a first end of the reaction pipe 3 into a space above the partition 5 and is flowed out from a second end of the reaction pipe 3. The susceptor 4 in which a plurality of wafers W are mounted in the recesses 43 is rotated at a predetermined speed in a circumferential direction. With this operation, an epitaxial film is grown on a surface of each of the wafers W. A growth speed of the epitaxial film is in a range from 0.4 µm/min to 4 µm/min, whereby a thick epitaxial film having a thickness of 50 µm or more is grown at a high speed.

Prior to this operation, each of the wafers W is placed by a robot at a predetermined position (a position at which the wafer W is concentric with the recess 43) in the recess 43 of the susceptor 4. At this time, the wafer W may possibly be slid from the predetermined position in a radial direction in the recess 43. Further, the wafer W may possibly be slid from the predetermined position in a radial direction in the recess 43 even by the rotation of the susceptor 4 during the operation.

However, in the exemplary embodiment, since the center of the susceptor 4 is concave toward the lower surface 42 from the outer edge (i.e., since the concave direction of the susceptor 4 is toward the lower surface 42), when each of the wafers W is mounted in the recess 43, as shown by the chain double-dashed line in FIG. 2A, the wafers W are inclined so that a part of each of the wafers W near the outer edge of the susceptor 4 is positioned higher than a part of each of the wafers W near the center. Since the wafers W are thus inclined, the wafers W receive force directed toward the center of the susceptor 4. However, since the surface roughness Ra of the bottom 43A exceeds 0.5 µm, friction can restrain the wafers W from moving from the initial positions where the wafers W are mounted. Moreover, since the bottom 43A is formed rough, a minute space is formed between the wafer W and the bottom 43A. Gas remaining between the wafer and the bottom 43A can thus be removed through the space, so that the wafer W can be restrained from floating up and moving from the bottom 43A due to the residual gas.

When the susceptor 4 is rotated, the wafers W receive centrifugal force directed toward the outer edge of the susceptor 4. However, since the wafers W receive the force directed toward the center of the susceptor 4 due to the inclination of the wafers W, the wafers W can be restrained from moving within the respective recesses 43. Accordingly, the wafers W can be restrained from contacting with the respective inner circumferential surfaces 43B of the recesses 43 during the epitaxial film growth. Even when a thick film having a thickness of 50 µm or more is formed, occurrence of the sticking between the wafers W and the respective recesses 43 to be caused by the bridge deposition can be restrained.

When the concave depth D2 at the center of the susceptor 4 is large, a difference between a distance from the outer edge of the susceptor 4 to the induction coil 7 (heating unit) disposed under the susceptor 4 and a distance from the center of the susceptor 4 to the induction coil 7 is increased. In such an arrangement, a temperature distribution in a plane of the wafer W becomes uneven, which may cause slip dislocation.

However, since D2/D1 is less than 0.3%, during the epitaxial film growth, the difference between the distance from the outer edge of the susceptor 4 to the induction coil 7 and the distance from the center of the susceptor 4 to the induction coil 7 can be reduced, so that the temperature distribution in the plane of the wafer W can be substantially even and occurrence of the slip dislocation can be restrained. Even when the heating unit is provided above the susceptor 4, a large concave depth D2 may cause an uneven temperature distribution in the plane of the wafer W. However, occurrence of the slip dislocation can be restrained by setting D2/D1 at less than 0.3%.

When the surface roughness Ra of the bottom 43A is large, since a distance between points where the wafer W is in contact with the bottom 43A is long, the temperature distribution in the plane of the wafer W may be deteriorated to deteriorate SFQR (Site Front Least-Squares Range).

However, since the surface roughness Ra of the bottom 43A is less than 16 µm, the distance between points where the wafer W is in contact with the bottom 43A can be enough to avoid deterioration of the temperature distribution in the plane of the wafer W, so that deterioration of SFQR can be restrained.

SFQR is an index for expressing flatness in a predetermined site in accordance with SEMI Standards. SFQR for evaluating each site is a value obtained as a sum of the absolute values of the maximum positive deviation (on an upper side of the horizontally placed wafer with a main surface facing upward) and the maximum negative deviation (on a lower side of the above wafer) from a reference surface obtained by the least square method in the predetermined site.

The rotation speed of the susceptor 4 during the epitaxial film growth step only needs to be set according to the diameter D1 of the susceptor 4, the value of D2/D1, a difference between the inner diameter of the recess 43 and the diameter of the wafer W, the thickness of the epitaxial film, conditions of reaction gas, and the like so that the sticking and the slip dislocation do not occur or SFQR is not deteriorated. For instance, the rotation speed of the susceptor 4 is preferably in a range from 4 rpm to 12 rpm.

Figure 3A:
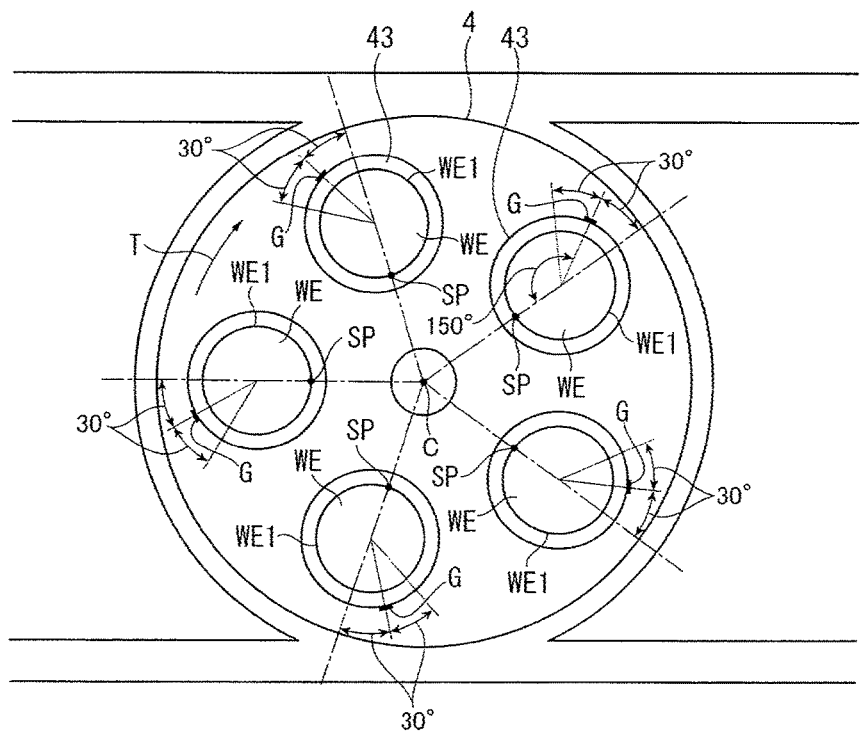
FIG. 3A shows a position in a plan view of a silicon grain boundary formation region existing on an epitaxial silicon wafer manufactured by the vapor deposition apparatus.

In an epitaxial silicon wafer WE in which occurrence of the sticking is restrained, a silicon grain boundary formation region G exists as shown in FIG. 3A. Herein, the silicon grain boundary formation region G means a region in which monocrystalline silicon forms a grain boundary and the grain boundary is epitaxially grown.

Provided that the closest position to a rotation center C of the susceptor 4 in a chamfered portion WE1 of the epitaxial silicon wafer WE is defined as a reference position SP, the silicon grain boundary formation region G exists between a position shifted by 120 degrees and a position shifted by 180 degrees from the reference position SP toward a rotation direction T (e.g., in a clockwise direction). It is estimated that the silicon grain boundary formation region G is generated at such positions because of influences of the rotation of the susceptor 4.

Figure 3B:
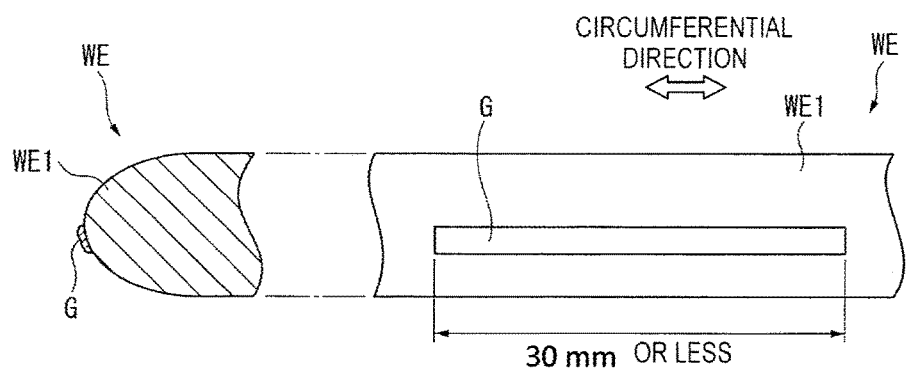
FIG. 3B shows positions in a cross-sectional view and a lateral side view of the silicon grain boundary formation region existing on the epitaxial silicon wafer manufactured by the vapor deposition apparatus.

Moreover, the silicon grain boundary formation region G exists at a position on a rear side (i.e., near the recess 43) of the chamfered portion WE1 as shown in FIG. 3B. As shown sticking can be restrained by controlling the silicon grain boundary formation region G.

Other Embodiment(s)

The scope of the invention is not limited to the above-mentioned embodiment(s), but includes a variety of improvements and configuration modifications as far as an inventive concept of the invention is accomplished.

For instance, D2/D1 may be 0.3% or more.

Moreover, the surface roughness Ra of the bottom 43A of the recess 43 may be 0.5 μm or less, or alternatively, 16 μm or more.

Further, the susceptor of the invention may be used for a vertical (e.g., pancake) type vapor deposition apparatus.

EXAMPLE(S)

Next, examples of the invention will be described below, but by no means limit the invention.

Test 1: Relationship Between Flexure Ratio of Susceptor and Occurrence of Sticking and Slip Dislocation Susceptors each having a 650-mm diameter, recesses each having a 203-mm inner diameter, a 5-μm surface roughness Ra of the bottom of each of the recesses, and respective flexure ratios shown in Table 1 were prepared. The susceptors of which a concave direction is toward the lower surface are each formed as shown in FIG. 2A. The susceptors in which the concave direction is toward the upper surface are each formed so that the vertical height of the upper surface from the bottom of the reaction pipe is gradually increased from the outer edge toward the center. The flexure ratio was obtained by disposing each of the susceptors with its upper surface facing upward on a horizontal surface, measuring a roughness of the upper surface using a laser, and dividing a concave depth at the center relative to the outer edge by a diameter of each of the susceptors.

TABLE 1

| | Example 1 | Example 2 | Example 3 | Example 4 | Example 5 | Comparative 1 | Comparative 2 | Reference Ex. |
|---|---|---|---|---|---|---|---|---|
| Flexure ratio | 0.018% | 0.036% | 0.075% | 0.100% | 0.300% | 0.029% | 0.056% | 0.0% |
| Concave direction | toward lower surface | toward lower surface | toward lower surface | toward lower surface | toward lower surface | toward upper surface | toward upper surface | — | on a right side of FIG. 3, a length of the silicon grain boundary formation region G in a circumferential direction of the epitaxial silicon wafer WE is 30 mm or less. It is estimated that the silicon grain boundary formation region G is generated only on the rear side of the chamfered portion WE1 because contact between the wafer W and the inner circumferential surface 43B of the recess 43 is restrained during the growth of the epitaxial film as described above, in other words, because a gap is formed between the entire circumference of the wafer W and the inner circumferential surface 43B and because the gas flow, accumulation of the inflow gas, heat distribution and the like on the rear side are different from those on a top side of the wafer W (i.e., a side of the wafer W where the epitaxial film is formed).

The silicon grain boundary formation region G having the above characteristics exists on the epitaxial silicon wafer WE in which occurrence of the sticking is restrained. Accordingly, it can be estimated that the occurrence of the Next, each of the susceptors was attached to a vapor deposition apparatus. Wafers each having a 200-mm diameter were mounted at a predetermined position (a position at which the wafer W was concentric with the concave portion) in each of the recesses. An epitaxial film was formed under conditions that the rotation speed of the susceptor was 4 rpm and a film thickness of the epitaxial film was 70 μm. Subsequently, the epitaxial wafers were taken out from the recesses. An outer circumferential surface of each of the epitaxial wafers was visually checked for presence or absence of the sticking. 100 pieces of the epitaxial wafer were manufactured each in Examples 1 to 5, Comparatives 1 and 2, and Reference Example. An occurrence ratio of sticking in each of Examples 1 to 5, Comparatives 1 and 2, and Reference Example was obtained. The results are shown in the graph of FIG. 4.

Figure 4:
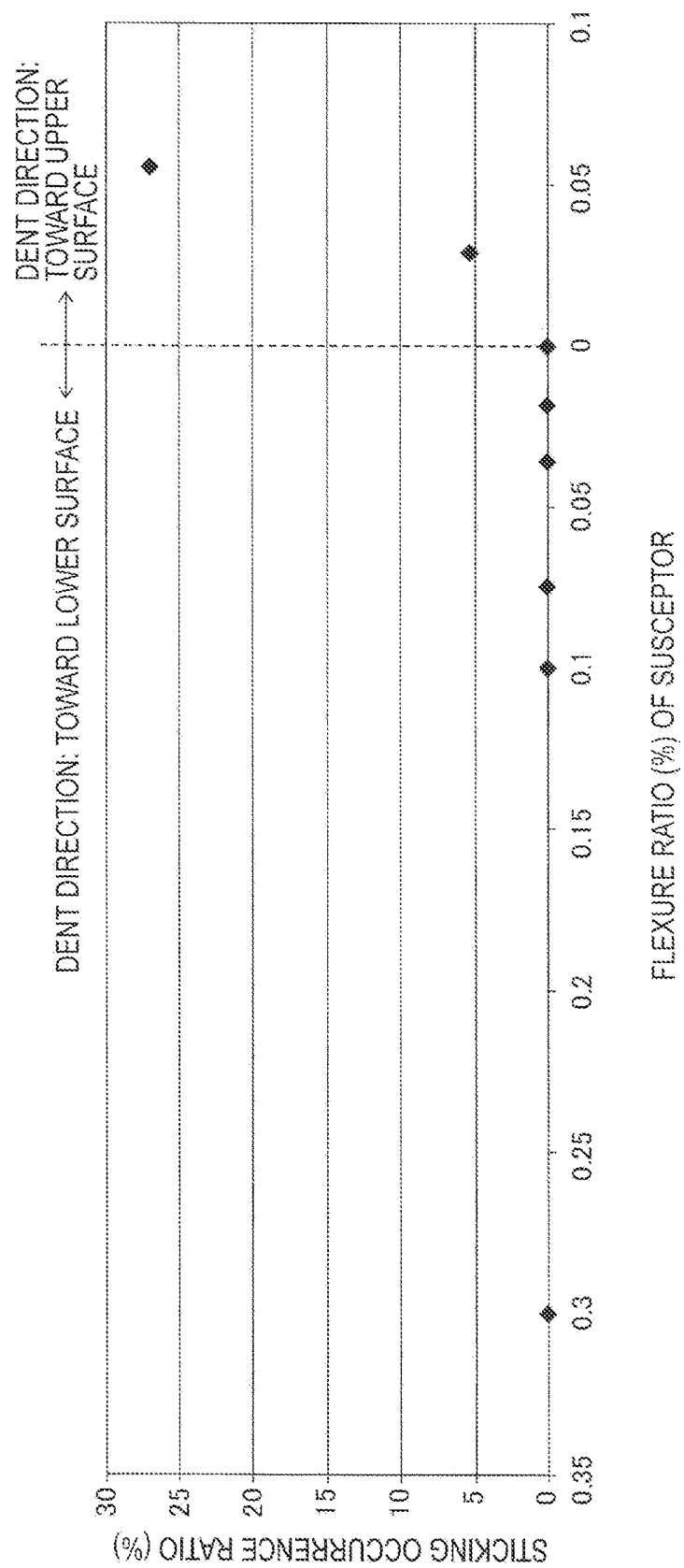
FIG. 4 is a graph showing a relationship between a flexure ratio of a susceptor and an occurrence ratio of sticking in Examples of the invention.

As shown in FIG. 4, it was observed that the occurrence ratio of the sticking was increased as the concave depth was increased in Comparatives 1 and 2 in which the concave direction was toward the upper surface, but no sticking occurred in Examples 1 to 5 in which the concave direction was toward the lower surface.

Based on this observation, it was confirmed that the epitaxial wafer with a restrained occurrence of the sticking can be manufactured by using the susceptor concave toward the lower surface.

The epitaxial wafers of Examples 1 to 5 were checked in terms of presence or absence of the slip dislocation. As a result, it was observed that the slip dislocation occurred in Example 5 and no slip dislocation occurred in Examples 1 to 4.

Based on this observation, it was confirmed that the epitaxial wafer with a restrained occurrence of the sticking and a restrained generation of the slip dislocation can be manufactured by using the susceptor concave toward the lower surface and having a flexure ratio of more than 0% to less than 0.3%.

Test 2: Relationship Between Surface Roughness Ra of Recess and Slippage of Wafer Susceptors each having a 650-mm diameter, recesses each having a 203-mm inner diameter, the respective flexure ratios of the susceptors and the surface roughness Ra of the bottom of each of the recesses shown in Table 2 were prepared. Each of the susceptors was attached to a vapor deposition apparatus. Wafers each having a 200-mm diameter were mounted at a predetermined position (a position at which the wafer W was concentric with the concave portion) in the recesses. An epitaxial film was grown under conditions that the rotation speed of the susceptor was 4 rpm and a film thickness of the epitaxial film was 70 μm. Subsequently, presence or absence of slippage of the wafers in the recesses and presence or absence of contact between the inner circumferential surface of the recesses and the wafers were visually checked. The epitaxial wafers were taken out of the recesses. SFQR was measured using a flatness measurement device (UltraScan9800, manufactured by ADE Corporation) at a site of 22 mm×22 mm in a region away from an outer edge of each of the wafers by 2 mm. The results are shown in Table 2.

Slippage of the wafers was determined as "present" at 0.5 mm or more. "slightly present" in a range from 0.1 mm or more to less than 0.5 mm, and "absent" at 0 mm. SFQR was determined as "deteriorated" at 0.5 μm or more and "favorable" at less than 0.5 μm.

circumferential surface of the recess and the wafer was absent and occurrence of the sticking is restrained can be manufactured by using the susceptor having more than 0.5 μm of the surface roughness Ra of the bottom of the concave portion.

Moreover, it was observed in Experiment 6 that SFQR was deteriorated although the contact between the inner circumferential surface of the recess and the wafer was absent.

Based on this observation, it was confirmed that the epitaxial wafer having a favorable SFQR can be manufactured by using the susceptor having less than 16 μm of the surface roughness Ra of the bottom of the concave portion.

Test 3: Existing Position of Silicon Grain Boundary Adhesion Region

A susceptor and a p+ type silicon wafer having the following features were prepared.

<Susceptor>
  Flexure ratio: larger than 0% and less than 0.3%
  Concave direction: toward the lower surface
  Number of the recesses: 5
  Surface roughness Ra of the bottom of the concave portion: from more than 0.5 μm to less than 16 μm
  Inner diameter of the concave portion: 203 mm
<Silicon Wafer>
  Diameter: 200 mm
  Dopant: boron
  Resistivity: 0.03 Ω·cm Next, the susceptor was attached to the vapor deposition apparatus. The p+ type silicon wafer was mounted at a predetermined position (a position at which the wafer W was concentric with the concave portion) in each of the recesses. Double-layered epitaxial film having the following characteristics was formed under conditions that the rotation speed of the susceptor was 4 rpm. Consequently, about 900 epitaxial silicon wafers were manufactured.

<First Layer: Epitaxial Film (n+ Type) (on Silicon Wafer)>
  Dopant: phosphorus
  Film Thickness: 10 μm
  Resistivity: 0.3 Ω·cm
<Second Layer: Epitaxial Film (n Type) (on First Layer of Epitaxial Film)>
  Dopant: phosphorus
  Film Thickness: 60 μm
  Resistivity: 50 Ω·cm

TABLE 2

|  | Experiment 1 | Experiment 2 | Experiment 3 | Experiment 4 | Experiment 5 | Expemiment 6 |
| --- | --- | --- | --- | --- | --- | --- |
| Surface roughness Ra of bottom of recess | 0.5 μm | 5 μm | 7 μm | 10 μm | 13 μm | 16 μm |
| Flexure ratio | 0.010% | 0.010% | 0.010% | 0.010% | 0.010% | 0.010% |
| Concave direction | toward lower surface | toward lower surface | toward lower surface | toward lower surface | toward lower surface | toward lower surface |
| Slippage of silicon wafer | present | slightly present | slightly present | absent | absent | absent |
| Contact between inner circumferential surface of recess and silicon wafer | present | absent | absent | absent | absent | absent |
| SFQR | favorable | favorable | favorable | favorable | favorable | deteriorated |

As shown in Table 2, it was observed in Experiment 1 that the contact between the inner circumferential surface of the recess and the wafer was present although SFQR was favorable.

Based on this observation, it was confirmed that the epitaxial wafer in which the contact between the inner Presence or absence of the sticking on the manufactured epitaxial silicon wafers was checked. No occurrence of the sticking was observed on all the epitaxial silicon wafers.

Next, the outer circumferential surface of each of the epitaxial wafers was observed using a digital microscope (manufactured by KEYENCE CORPORATION: VHX- 100F). The existing position and the length of the silicon grain boundary formation region were checked.

Figure 5:
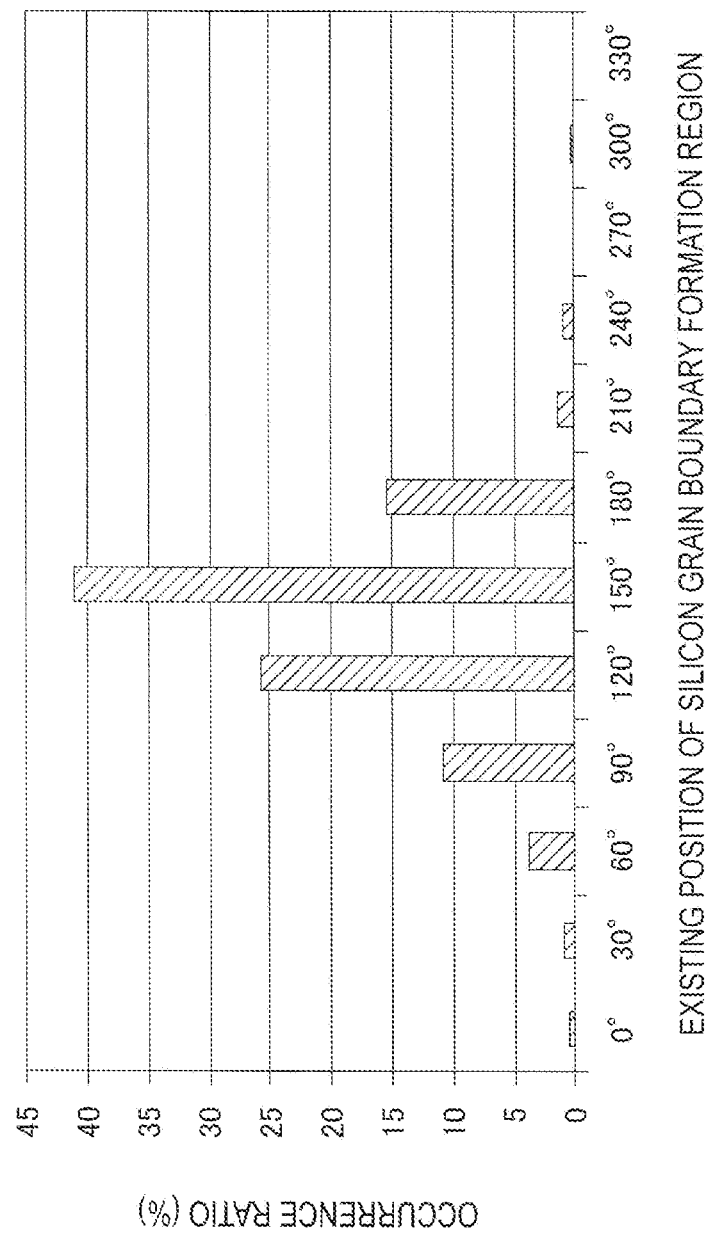
FIG. 5 is a graph showing frequency distribution of the existing positions of the silicon grain boundary formation regions in the above Examples.
Figure 6:
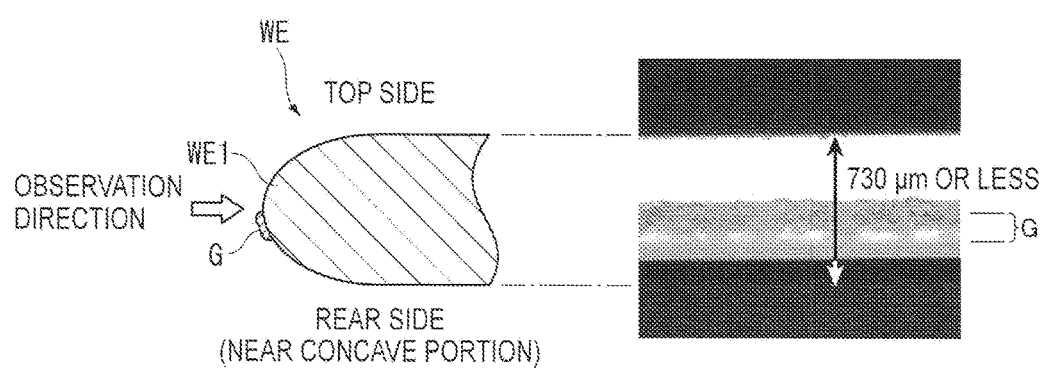
FIG. 6 is a schematic illustration in a cross-sectional view and a photograph taken from a lateral side of the silicon grain boundary formation region in the above Examples.

FIG. 5 shows frequency distribution of the existing position of the silicon grain boundary formation region. FIG. 6 shows a schematic illustration in a cross-sectional view of the silicon grain boundary formation region and an observation photograph taken from the lateral side of the silicon grain boundary formation region.

In FIG. 5, an abscissa axis indicates an angle in the rotation direction (e.g., in the clockwise direction) of the susceptor, provided that the reference position SP in FIG. 3A is defined as zero degrees. The abscissa axis was marked every 30 degrees. When a part of the silicon grain boundary formation region existed at any position at the angles every 30 degrees, the position was counted as the existing position. Further, when no part of the silicon grain boundary formation region existed at all the positions at the angles every 30 degrees, the closest position to the silicon grain boundary formation region was counted as the existing position.

As shown in FIG. 5, the silicon grain boundary formation region was the most frequently generated at the position at the angle of 150 degrees, the second most frequently generated at the position at the angle of 120 degrees, and the third most frequently generated at the position at the angle of 180 degrees. Based on this observation, it was confirmed that most of the silicon grain boundary formation region existed between the position shifted by 120 degrees and the position shifted by 180 degrees in the rotation direction of the susceptor from the reference position SP.

Moreover, it was observed that the silicon grain boundary formation region G existed on the rear side of the chamfered portion as shown in FIG. 6. In FIG. 6, "730 μm or less" indicates a thickness of the epitaxial silicon wafer.

Further, it was observed that the silicon grain boundary formation region on a single epitaxial silicon wafer existed only at a single position.

recesses with an inner diameter of 203 mm and the silicon wafers with a diameter of 200 mm were prepared.

Next, the susceptor of Example 6 was attached to the vapor deposition apparatus. The p+ type silicon wafer was mounted at a predetermined position (a position at which the wafer was concentric with the concave portion) in each of the recesses. The same double-layered epitaxial film as that in Test 3 (first layer of the film: n+ type, second layer of the film: n type) was formed under conditions that the rotation speed of the susceptor was 4 rpm. Consequently, five epitaxial silicon wafers (in one batch) were manufactured.

The five epitaxial silicon wafers were evaluated in terms of the occurrence ratio of the sticking and the occurrence condition of the slip dislocation according to the same method as in Test 1 and in terms of SFQR according to the same method as in Test 2. A circumferential length of the silicon grain boundary formation region of each of the epitaxial silicon wafers was measured according to the same method as in Test 3. In Examples 7 to 12 and Comparatives 3 and 4, the epitaxial wafers were manufactured and evaluated in the same manner as in Example 6. The results are shown in Table 3.

The slip dislocation was determined as "none" at 0 mm of an integrated slip length by a visual check, "slight" in a range of more than 0 mm to 100 mm or less, and "deteriorated" at more than 100 mm. Herein, when a single slip dislocation is generated, the integrated slip length indicates a length of the single slip dislocation. When a plurality of slip dislocations are generated, the integrated slip length indicates a value obtained by summing all lengths of the plurality of slip dislocations. Moreover, in Table 3, the length of the silicon grain boundary formation region was an average value in the five epitaxial silicon wafers and the slip dislocation and SFQR were the same in all five epitaxial silicon wafers.

TABLE 3

| | Ex. 6 | Ex. 7 | Ex. 8 | Ex. 9 | Ex. 10 | Ex. 11 | Ex. 12 | Comp. 3 | Comp. 4 |
|---|---|---|---|---|---|---|---|---|---|
| Flexure ratio of susceptor | 0.018% | 0.036% | 0.075% | 0.100% | 0.250% | 0.300% | 0.350% | 0.029% | 0.056% |
| Concave direction of susceptor | toward lower surface | toward lower surface | toward lower surface | toward lower surface | toward lower surface | toward lower surface | toward lower surface | toward upper surface | toward upper surface |
| Sticking occurrence | 0% | 0% | 0% | 0% | 0% | 0% | 0% | 5% | 27% |
| Length of silicon grain boundary formation region | 20 mm | 20 mm | 20 mm | 15 mm | 15 mm | 15 mm | 10 mm | — | — |
| SFQR | favorable | favorable | favorable | favorable | favorable | favorable | favorable | favorable | favorable |
| Slip dislocation | none | none | none | none | none | slight | deteriorated | none | deteriorated |

Test 4: Relationship Between Flexure Ratio of Susceptor and Sticking, Silicon Grain Boundary Adhesion Region, SFQR and Slip Dislocation Susceptors were prepared according to Table 3 below. The susceptors in Examples 6 to 9 and 11 and Comparatives 3 and 4 were the same as the susceptors in Examples 1 to 5 and Comparatives 1 and 2 in Test 1 and the susceptors in Examples 10 and 12 were the same as the susceptor in Example 6 except for the flexure ratio.

The same p+ type silicon wafers as those in Test 3 were prepared. Specifically, the susceptors each having the As shown in FIG. 3, it was observed that the occurrence ratio of the sticking was increased as the concave depth was increased in Comparatives 3 and 4 in which the concave direction was toward the upper surface, but no sticking occurred in Examples 6 to 12 in which the concave direction was toward the lower surface.

Moreover, in Examples 6 to 12 in which no sticking occurred, it was observed that the length of the silicon grain boundary formation region was decreased as the concave depth was increased. Further, SFQR was favorable irrespective of the concave direction and the concave depth.

It was also observed that no slip dislocation occurred in Examples 6 to 10 in which the flexure ratio was less than 0.3% but the slip dislocation occurred in Examples 11 and 12 in which the flexure ratio was 0.3% or more. It was also observed that the slip dislocation was more likely to occur at a larger flexure ratio both in Examples and Comparatives.

Based on this observation, it was confirmed that the epitaxial wafer having the length of the silicon grain boundary formation region of 30 mm or less, with a restrained occurrence of the sticking and a restrained generation of the slip dislocation and with a favorable SFQR can be manufactured by using the susceptor concave toward the lower surface and having the flexure ratio of more than 0% to less than 0.3%.

Test 5: Relationship Among Film Thickness of Epitaxial Film, Length of Silicon Grain Boundary Adhesion Regions and Breakage of Epitaxial Silicon Wafer The same silicon wafers and susceptors as those in Test 3 were prepared.

Next, each of the susceptors was attached to the vapor deposition apparatus. The p+ type silicon wafer was mounted at a predetermined position (a position at which the wafer was concentric with the concave portion) in each of the recesses. Double-layered epitaxial film having the following characteristics was formed at the film thickness shown in Table 4. Consequently, five epitaxial silicon wafers (in one batch) were manufactured in each of Experiments 7 to 12.

<First Layer: Epitaxial Film (n+ type) (on Silicon Wafer)>
  Dopant: phosphorus
  Resistivity: 0.3 Ω·cm
<Second Layer: Epitaxial Film (n Type) (on First Layer of Epitaxial Film)>
  Dopant: phosphorus
  Resistivity: 50 Ω·cm

TABLE 4

|  | Experiment 7 | Experiment 8 | Experiment 9 | Experiment 10 | Experiment 11 | Experiment 12 |
| --- | --- | --- | --- | --- | --- | --- |
| Film thickness of first layer | 10 μm | 10 μm | 10 μm | 10 μm | 10 μm | 10 μm |
| Film thickness of second layer | 20 μm | 40 μm | 60 μm | 90 μm | 140 μm | 150 μm |
| Total film thickness | 30 μm | 50 μm | 70 μm | 100 μm | 150 μm | 160 μm |

A circumferential length of the silicon grain boundary formation region of each of the five epitaxial silicon wafers was measured according to the same method as in Test 3 and an average value in each of Experiments 7 to 12 was calculated. The results are shown in the graph of FIG. 7.

Figure 7:
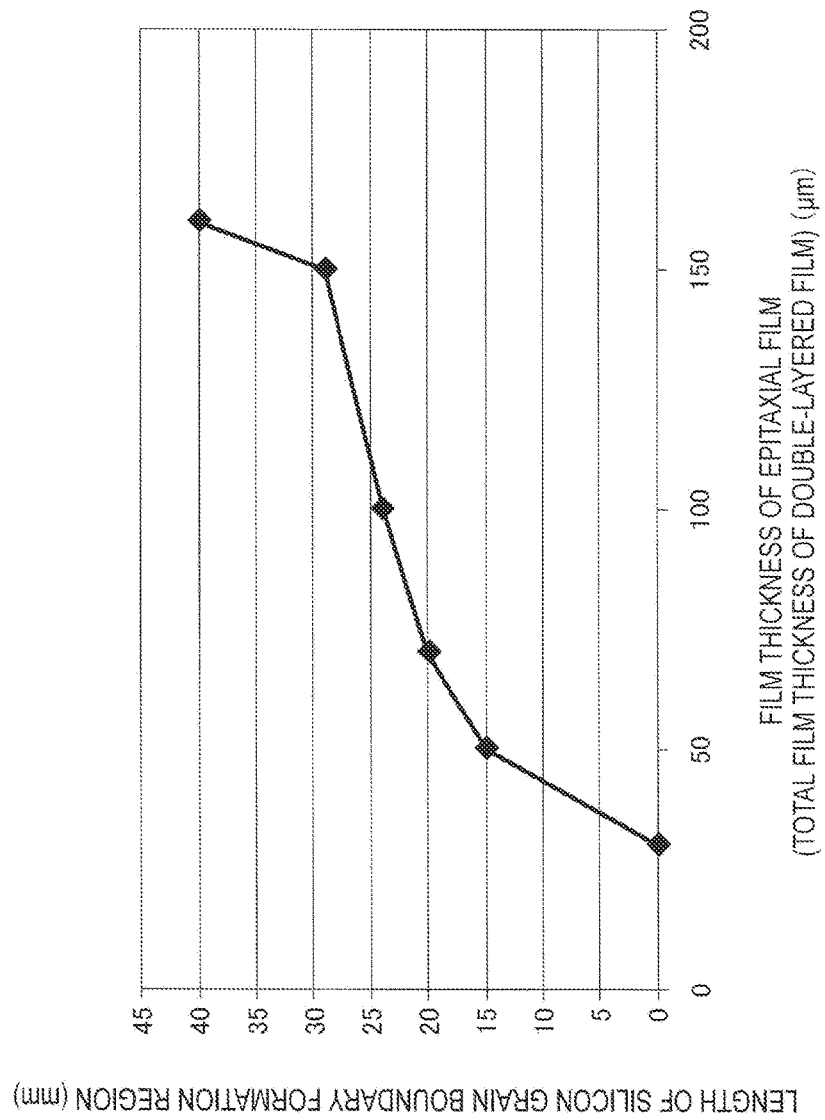
FIG. 7 is a graph showing a relationship between a film thickness of an epitaxial film and a length of the silicon grain boundary formation regions in the above Examples.

As shown in the graph of FIG. 7, it was observed that no silicon grain boundary formation region existed in the epitaxial silicon wafer having the total film thickness of 30 μm or less of the double-layered epitaxial film. On the other hand, it was observed that the silicon grain boundary formation region existed in the epitaxial silicon wafer having 50 μm or more of the total film thickness of the epitaxial films and the length of the silicon grain boundary formation region was increased as the total film thickness was increased.

Moreover, it was observed that no sticking occurred in the epitaxial silicon wafer having the silicon grain boundary formation region of 30 mm or less (the total thickness of the epitaxial film of 150 μm or less), but the sticking occurred in the epitaxial silicon wafer exceeding 30 mm although the silicon grain boundary formation region existed therein, so that the epitaxial silicon wafer was broken when removed from the recess of the susceptor.

Based on this observation, it was confirmed that occurrence of sticking and generation of breakage in the epitaxial silicon wafer was inhibitable by providing the length of the silicon grain boundary formation region at 30 mm or less even when the total film thickness of the epitaxial films was as thick as in a range from 50 μm to 150 μm.

In Tests 3 to 5, the epitaxial silicon wafers having the double-layered epitaxial film were evaluated. However, it is considered that the same evaluation results as those in Tests 3 to 5 are obtainable even when a single-layered epitaxial film or a triple-layered epitaxial film is formed, as long as the total film thickness is the same as that in the double-layered epitaxial film.

Moreover, it is considered that the same evaluation results as those in Tests 3 to 5 are obtainable even when the dopant and the resistivity of the silicon wafer and the epitaxial film are different from those in Test 3 to 5.

What is claimed is:

1. A disc-shaped susceptor that is provided in a vapor deposition apparatus and on which wafers are mounted, the susceptor comprising:
    a plurality of recesses that are aligned in a circumferential direction on an upper surface of the susceptor and in which the wafers are respectively mounted, wherein
    the susceptor is formed so that a center of the susceptor is concave toward a lower surface thereof from an outer edge thereof,
    wherein a diameter of the susceptor is denoted by D1 and a concave depth at the center relative to the outer edge on the upper surface of the susceptor is denoted by D2, the susceptor is formed at D2/D1 in a range from more than 0% to less than 0.3%, and
    a bottom of the recess has a surface roughness Ra that is more than 0.5 μm.

2. The susceptor according to claim 1, wherein the surface roughness Ra is less than 16 μm.

3. A vapor deposition apparatus comprising the susceptor according to claim 1.

4. A vapor deposition method using the vapor deposition apparatus according to claim 3, the method comprising:
    mounting the wafers in the plurality of recesses of the susceptor, and
    growing an epitaxial film on a surface of each of the wafers while rotating the susceptor.

* * * * *